(12) United States Patent
Martini et al.

(10) Patent No.: US 7,031,350 B2
(45) Date of Patent: *Apr. 18, 2006

(54) CODING OF DATA STREAM

(75) Inventors: Maria Giuseppina Martini, Perugia (IT); Marco Chiani, Rinimi (IT)

(73) Assignee: Koninklijke Philips Electronics N.V., Eindhoven (NL)

(*) Notice: Subject to any disclaimer, the term of this patent is extended or adjusted under 35 U.S.C. 154(b) by 942 days.

This patent is subject to a terminal disclaimer.

(21) Appl. No.: 09/906,608

(22) Filed: Jul. 17, 2001

(65) Prior Publication Data

US 2002/0031122 A1    Mar. 14, 2002

(30) Foreign Application Priority Data

Jul. 17, 2000   (EP)   .................................. 00202531

(51) Int. Cl.
H04J 3/02    (2006.01)

(52) U.S. Cl. ...................... 370/537; 370/542; 375/253; 375/260

(58) Field of Classification Search ........ 370/536–538, 370/542–543; 375/246, 253, 260, 240.2
See application file for complete search history.

(56) References Cited

U.S. PATENT DOCUMENTS

| | | | |
|---|---|---|---|
| 4,895,613 A | 1/1990 | Carrico | 156/344 |
| 5,544,328 A * | 8/1996 | Seshadri | 375/261 |
| 5,671,156 A * | 9/1997 | Weerackody et al. | 714/52 |
| 5,729,526 A * | 3/1998 | Yoshida | 370/206 |
| 5,822,372 A * | 10/1998 | Emami | 375/260 |
| 5,886,364 A | 3/1999 | Zhang | 257/53 |
| 5,948,702 A | 9/1999 | Rotondaro | 438/707 |
| 6,028,896 A * | 2/2000 | Jang et al. | 375/240.04 |
| 6,711,182 B1 * | 3/2004 | Gibbs et al. | 370/537 |
| 6,873,629 B1 * | 3/2005 | Morris | 370/535 |

FOREIGN PATENT DOCUMENTS

| | | |
|---|---|---|
| EP | 0312956 A1 | 10/1988 |
| EP | 0849377 A2 | 12/1997 |

OTHER PUBLICATIONS

Wesel, Richard D., Trellis codes for Unequal Error Protection and Rate Variability, University of California, Final Report 1998-1999 for MICRO Project 98-170, Ind. Sponsor: Conexant System, pp. 1-4.*

(Continued)

*Primary Examiner*—Brian Nguyen
*Assistant Examiner*—Tri H. Phan
(74) *Attorney, Agent, or Firm*—Larry Liberchuk

(57) ABSTRACT

Coding a data stream is provided, wherein the data stream comprises at least one packet having a given packet length and respective partitions of the at least one packet are coded with different error protection rates, the respective lengths of the respective partitions being determined by respective predetermined percentages of the packet length or a fraction of the packet length.

9 Claims, 4 Drawing Sheets

OTHER PUBLICATIONS

Regunathan et al, Robust Video Compression for Time-Varying Wireless Channels, 1999, Dept. of Electrical and Computer Engineering, University of California, CA 93106, pp. 1-8.*

By John G. Proakis, Entitled "Digital Communications" 2$^{nd}$ Edition, McGraw-Hill, 1989, pp. 801-817.

Spread Sprectrum Signals for Digital Communications, Entitled: Generation of PN, pp. 831, 836.

By R. Talluri, Entitled: "Error-Resilient Video Coding in the ISO MPEG-4 Standard", IEEE Communication Magazine, vol. 36, No. 6, Jun. 1988, pp. 112-119.

By J. Hagenauer, Entitled: Rate Compatible Punctured Convolutional Codes (RCPC Codes) and Their Application, IEEE Trans. Commun., vol. 36, No. 4, Apr. 1988. pp. 389-400.

By Joachim Hagenauer Entitled: Channel Coding and Transmission Aspects for Wireless Multimedia, Proceedings of the IEEE, vol. 87, No. 10, Oct. 1999. pp. 1764-1777.

By W. Rabiner Heinzelman et al. Entitled: Unequal Error Protection of MPEG-4 Compressed Video, ICIP 1999.

* cited by examiner

CODING OF DATA STREAM

The invention relates to coding of a data stream.

The invention further relates to transmission and reception of a data stream.

Reference is made to the article of M. Budagavi, W. Rabiner Heinzelman, J. Webb, R. Talluri, "Wireless MPEG-4 Video Communication on DSP Chips", IEEE Signal Processing Magazine, January 2000. This article discloses that, to make the compressed bit-stream more robust, the MPEG-4 video compression standard incorporates several error resilience tools in its simple profile to enable detection, containment, and concealment of errors. These are powerful source-coding techniques for combating bit errors when they occur at rates less than $10^{-3}$; however, present-day wireless channels can have much higher bit error rates (BERs). The harsh conditions on mobile wireless channels result from multipath fading due to motion between the transmitter and the receiver, and changes in the surrounding terrain. Multipath fading manifests itself in the form of long bursts of errors. Hence, some form of interleaving and channel coding is required to improve the channel conditions. Using a combination of source and channel coding, it is possible to achieve acceptable visual quality over error-prone wireless channels with MPEG-4 simple-profile video compression. The structure of an MPEG-4 compressed bit-stream also lends itself to using unequal error protection (UEP), a form of joint source-channel coding, to ensure fewer errors in the important portions of the bitstream.

An object of the invention is to provide an improved transmission of data. To this end, the invention provides coding, decoding, transmission, reception, a data stream and a storage medium as defined in the independent claims. Advantageous embodiments are defined in the dependent claims.

The invention is especially advantageous in the field of wireless transmission of MPEG-4 video. The inventors recognized that that MPEG-4 packets are not exactly of the same length and that partitions have different lengths in different packets, due to the variable length coding used and to the requirement of having an integer number of macro-blocks in each packet. This implies that a fixed UEP scheme cannot be used and, in order to perform decoding with the correct code rate, the bit-stream structure should be known at the receiver, at channel decoding level. Packets, like partitions, are not of the same length; thus the UEP scheme should be dynamically changed for each packet and the knowledge of the partition length is required. The invention provides UEP for packets and partitions with variable length.

According to a first aspect of the invention, respective partitions of at least one packet in the data stream are coded with different error protection rates, wherein respective lengths of the respective partitions are determined by respective predetermined percentages of a length of the at least on packet or of a fraction of the packet length. By providing partitioning according to fixed percentages, UEP for packets with variable length is made possible.

In a practical embodiment, the lengths of all partitions within an entire packet are determined by a percentage of the packet length. However, the length of some partitions may also be determined by taking a fixed, predetermined length. Preferably, the lengths of the remaining partitions are then determined by percentages of a fraction of the packet length. This fraction usually being equal to the total of the lengths of the partitions of which the respective lengths are to be determined by a percentage (of the fraction). In practical embodiments this is equal to the packet length minus the sum of the fixed lengths. So a combination of fixed partition lengths and proportional partition lengths is possible.

Advantageously, the given packet length is determined as a distance between two markers in the data stream, wherein at least one of said two markers indicates a packet start.

Advantageously, wherein the respective predetermined percentages are determined such that a first partition of the packet comprises at least a first original packet partition. The first original packet partition may be a header of the packet. By choosing the first percentage such that in normal conditions, the header is always included in the first partition, the entire header can be protected with a same protection rate, which is preferably higher than for subsequent partitions. Further percentages are preferably determined such that a sum of the given partition and previous partitions include a same number of original partitions.

In a decoder according to an embodiment of the invention, a data stream comprising at least one packet having a given packet length, wherein respective partitions of the at least one packet have been coded with different error protection rates, wherein respective lengths of the respective partitions are determined by respective predetermined percentages of the packet length, is received and the respective packet partitions are decoded with the different error protection rates.

The aforementioned and other aspects of the invention will be apparent from and elucidated with reference to the embodiments described hereinafter.

The drawings only show those elements that are necessary to understand the invention.

Due to compression and in particular to the use of predictive coding and Variable Length Coding (VLC), an MPEG-4 bit-stream is very sensitive to errors. The article of R. Talluri, "Error-resilient video coding in the ISO MPEG-4 standard", IEEE Communication Magazine, vol. 36, no.6, June 1988 describes error resilience aspects of the video coding techniques that are standardized in the ISO MPEG-4 standard. The specific tools adopted into the ISO MPEG-4 standard to enable the communication of compressed video data over noisy wireless channels are presented in detail. These techniques include resynchronization strategies, data partitioning, reversible Variable Length Codes, and header extension codes.

Figure 1:
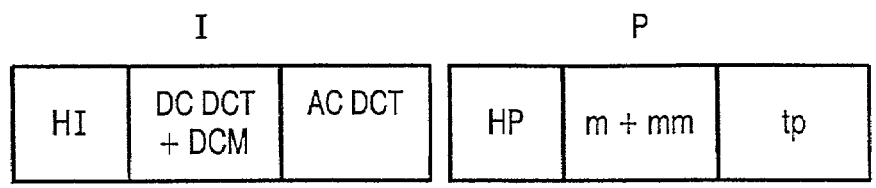
FIG. 1 shows data partitioning in the MPEG-4 bit-stream.

These tools help adding robustness to the MPEG-4 bit-stream. With the use of Resync markers, the MPEG-4 bit-stream results composed of packets, which are of almost the same length. Regardless of such tools, achievable received quality is still poor when MPEG-4 is transmitted over a wireless channel. Error resilience tools can, however, produce a further improvement of the received video quality if exploited at channel coding level. In particular, the data partitioning tool can be usefully exploited with the purpose of performing Unequal Error Protection (UEP): information bits contained in each packet are separated in three partitions, each of which has a different sensitivity to channel errors. As shown in FIG. 1 for I frames, partitions consist of a header HI, and DC DCT coefficients and AC coefficients separated by a DC marker DCm. As far as P frames are concerned, partitions consist of a header HP, and a motion partition m and a texture partition tp separated by a motion marker mm.

A suitable technique taking into account the characteristics of both the wireless channel and of the application is described. Specifically, information about the different sensitivity of source bits to channel errors should be exploited through UEP. This technique consists in performing error protection according to the perceived sensitivity of source bits to errors: more sensitive bits are protected with a higher protection (corresponding to a lower rate code), for less important bits a lower protection (i.e. a higher rate code) is used. Compared to classical Forward Error Correction (FEC), UEP allows achieving a higher perceived video quality given the same bit-rate, through the exploitation of the characteristics of the source.

In the proposed scheme, the three partitions are protected with different code rates, according to the subjective importance of the relevant information. Information contained in headers is crucial for the successive decoding of the packet, thus those should be strongly protected. For intra frames, DC coefficients have a higher subjective importance than AC coefficients; thus the DC coefficients should be higher protected than the AC coefficients. As far as predicted frames are concerned, motion data should be more protected than texture data, as if motion information is correctly received texture information may be partially reconstructed.

The UEP implementation proposed takes also into account the different importance of different types of frames: in the MPEG-4 standard. Intra, Predicted and Backward predicted frames are considered, where Intra frames are coded independently from the others and Predicted frames exploit information from contiguous frames.

Figure 2:
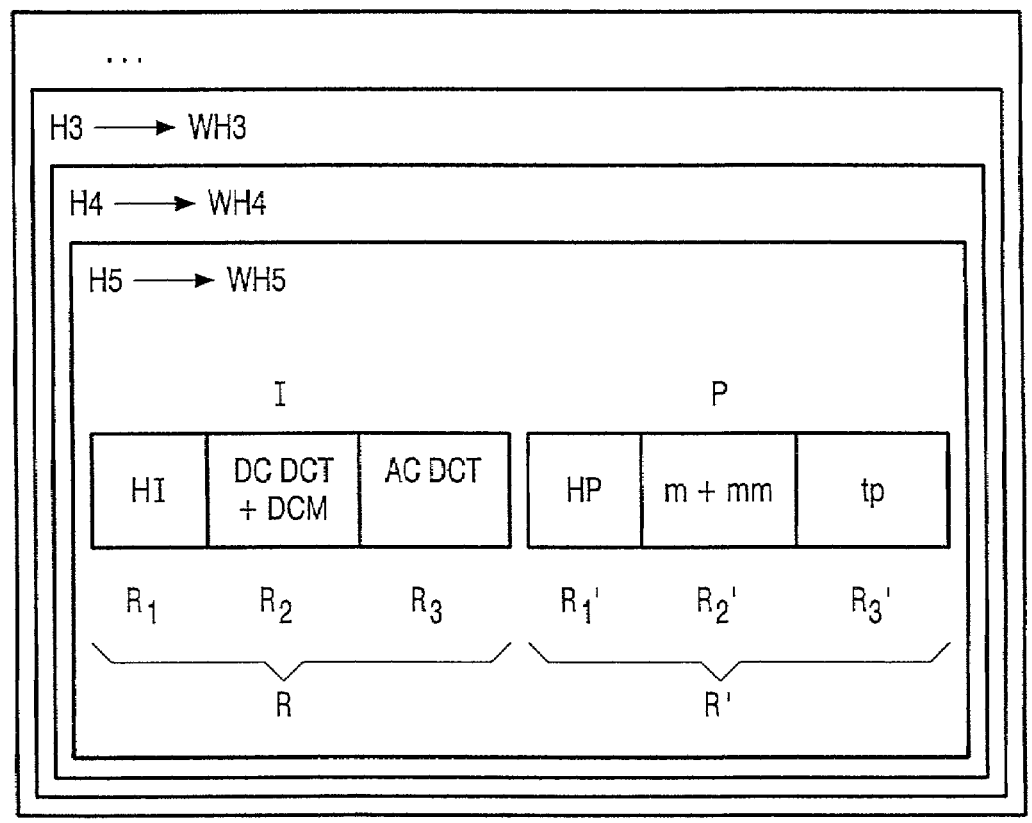
FIG. 2 shows a schematic representation of a protection scheme according to an embodiment of the invention.

A correct reception of Intra frames is crucial to perform motion compensation of the subsequent Predicted frames, thus a lower average channel coding rate (i.e. a higher protection) should be associated to Intra frames, while Predicted frames can be coded with a higher average rate (i.e. a lower protection). FIG. 2 shows a schematic representation of the described protection scheme.

UEP may be performed through Rate Compatible Punctured Convolutional (RCPC) codes, with rates chosen according to a perceived importance of bits. In this case the codes considered are obtained by puncturing the same "mother" code. Only one coder and one decoder are then needed for performing coding and decoding of the whole bit-stream. Rate Compatible Punctured Convolutional Codes as such are known from the article of J. Hagenauer, "Rate-Compatible Punctured Convolutional Codes (RCPC Codes) and their Applications", IEEE Trans. Commun., vol.36, no.4, pp. 389–400, April 1988.

Different average code rates are taken into consideration for the protection of different frames (I frames are coded with a higher protection/ lower rate, a lower protection/ higher average rate is taken into consideration for P frames), and for each frame the data partitioning tool added to the MPEG-4 standard is exploited, in order to provide a stronger protection for the most significant partitions. A frame may be retransmitted if not correctly received.

An MPEG-4 coded bit-stream is structured in Video Objects (VO), Video Object Layers (VOL), Groups of Video Object Planes (GOV), Video Object Planes (VOP), and Packets. In order to allow synchronization, a start of each part of the bit-stream is indicated by a relevant start code. Start codes are unique words, recognizable from any legal sequence of variable length coded words. H1 indicates the start code for VO, H2 for the VOL, H3 for the GOV, H4 for the VOP and H5 the packet start code (resync)

A main problem is that MPEG-4 packets are not exactly of the same length and partitions have different lengths in different packets, due to the variable length coding used and to the requirement of having an integer number of macroblocks in each packet. This implies that a fixed UEP scheme cannot be used and, in order to perform decoding with the correct code rate, the bit-stream structure should be known at the receiver, at channel decoding level. Packets, like partitions, are not of the same length; thus the UEP scheme should be dynamically changed for each packet and the knowledge of the partition length is required. As far as this problem is concerned, a solution for performing UEP is proposed: Proportional UEP.

Proportional Unequal Error Protection (P-UEP)

Figure 6:
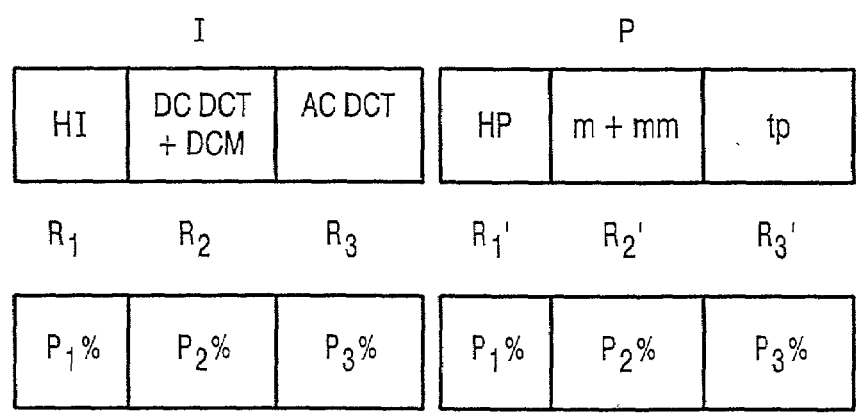
FIG. 6 shows proportional unequal error protection according to an embodiment of the invention.

FIG. 6 shows a scheme of Proportional Unequal Error Protection. As the length of each field is not known at the receiver, a proportional scheme is used, given the (variable) length of the packet. Packet length is preferably determined through the reception of two proper start codes (at least one of which is a packet start). A delay of one packet is introduced by such a scheme in order to fill the packet buffer. A percentage length is chosen for each partition taking into account the characteristics of the bit-stream. Given three partitions of percentage length $P_1$, $P_2$, $P_3$, protected with rates $R_1$, $R_2$, $R_3$, the average rate for I packets is given by:

$$R_{avg} = \frac{R_1 R_2 R_3}{P_1 R_2 R_3 + P_2 R_1 R_3 + P_3 R_1 R_2}$$

Similarly, for P packets:

$$R'_{avg} = \frac{R'_1 R'_2 R'_3}{P_1 R'_2 R'_3 + P_2 R'_1 R'_3 + P_3 R'_1 R'_2}$$

Consequently, the length of the coded packet is:

$$L_{coded\_packet\_I} = \frac{L_{packet}}{R_{avg}} + \frac{M}{R_3} \quad \text{for } I \text{ frames and}$$

$$L_{coded\_packet\_P} = \frac{L_{packet}}{R'_{avg}} + \frac{M}{R'_3} \quad \text{for } P \text{ frames}$$

where M is the memory of the code, in the case convolutional codes are considered. As for the memory M of the code: convolutional codes differ from block codes in that the encoder contains memory and the encoder outputs at any given time unit not only depend on the inputs at that time unit, but also on M previous input blocks, where M is the memory of the code. A memory M convolutional encoder consists of an M-stage shift register with the output of selected stages being added modulo-2 to form the encoded symbols. Since a convolutional coder is a sequential circuit, its operation can be described by a state diagram. The state of the encoder is defined as its shift register contents; thus an encoder may assume $2^M$ states. In order to protect the last bits of the bit-stream with the same strength of the others, M tail bits should be added to the bit-stream in order to force the encoder to converge back to a known state (typically the "0" state). In fact, if convolutional codes are considered, the packet is terminated by shifting M "0" bits into the shift register in order to allow a proper termination of the trellis. Tail bits are coded with the higher rate. In order to compute the total average rate, the average between I frames and P frames should be computed and the overhead introduced by the start codes substitutions should also be considered.

This aspect of the invention takes respective predetermined percentages of a variable packet length as respective packet partitions. The percentages are preferably determined such that a first partition of the packet comprises at least a first original packet partition (e.g. a header) and a sum of the first and second partitions comprise at least the first original packet partition and a second original packet partition, and so on, taking into account the characteristics of the data stream.

A second main problem is that MPEG-4 start codes are not robust to errors: a single error in a start code may cause missed detection, resulting in a loss of synchronization. In order to cope with these problems, the invention proposes some advantageous solutions. If errors occur, start codes emulation is possible, as well as a missed detection. In order to solve this problem, a start code substitution is proposed.

Start Code Substitution

Figure 3:
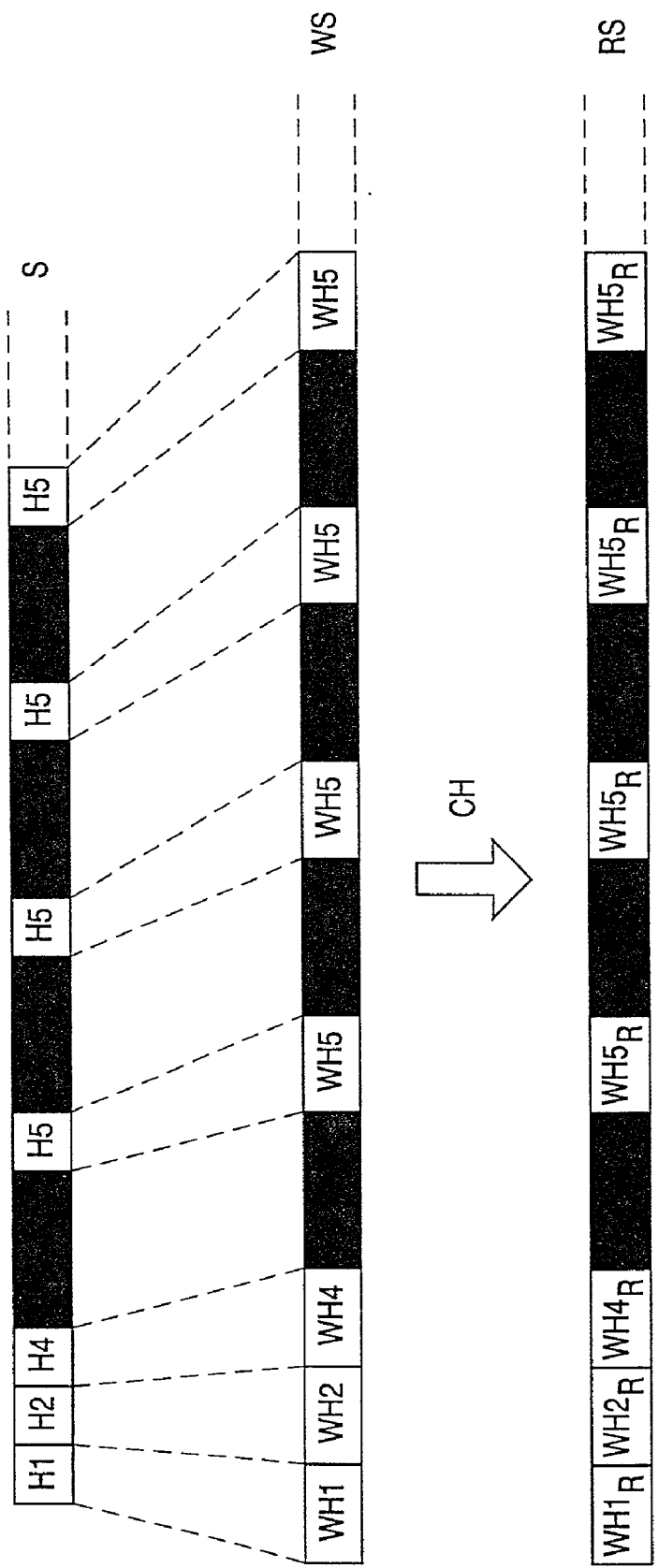
FIG. 3 shows start code substitution and (proportional) unequal error protection according to an embodiment of the invention.

In a further embodiment start codes are substituted after MPEG-4 coding (see FIG. 3) with pseudo-noise words, which are sequences with high correlation properties (e.g. Gold sequences). These new start codes are denoted by Wireless Start Codes. In particular, a substitution is performed for VO, VOL, VOP, GOV start codes and for the Resync marker. FIG. 3 shows a coded data stream S, comprising the markers H1 . . . H5. These markers are substituted with markers WH1 . . . WH5 which have a higher robustness to channel errors, to obtain a data stream WS which is suitable for wireless transmission. The data stream WS is received in a receiver as a data stream RS which is similar to WS but may have channel errors. The markers WH1 . . . WH5 are received as $WH1_R$ . . . $WH5_R$. The markers (words) $WH1_R$ . . . $WH5_R$ are similar to WH1 . . . WH5 but may have channel errors. Because these markers have high correlation properties, they are recognized as being WH1 . . . WH5 which are thereafter substituted by markers similar to H1 . . . H5 respectively. The data streams in FIG. 3 does not include the GOV start code (H3), considering the MPEG-4 bit-stream. In the MPEG-4 bit-stream there is no GOV start code (H3) after the VOL start code (H2), because the VOL start code (H2) also indicates the beginning of a GOV.

At the receiver side, the position of these wireless start codes WH1 . . . WH5 are estimated through correlation before the channel decoding process; a trade-off should be achieved between the probability of missing a start code and the probability of start codes emulation, thus the choice of the wireless start codes length and of a proper threshold for the correlation is performed accordingly. As the detection is performed, wireless start codes WH1 . . . WH5 are substituted with the corresponding start codes H1 . . . H5 from an original set of start codes. The described substitution is herewith transparent to the MPEG-4 decoder (see FIG. 5).

At channel coding level, an advantageous embodiment according to the invention is proposed:

Start Codes Substitution combined with Proportional Unequal Error Protection (P-UEP).

Figure 4:
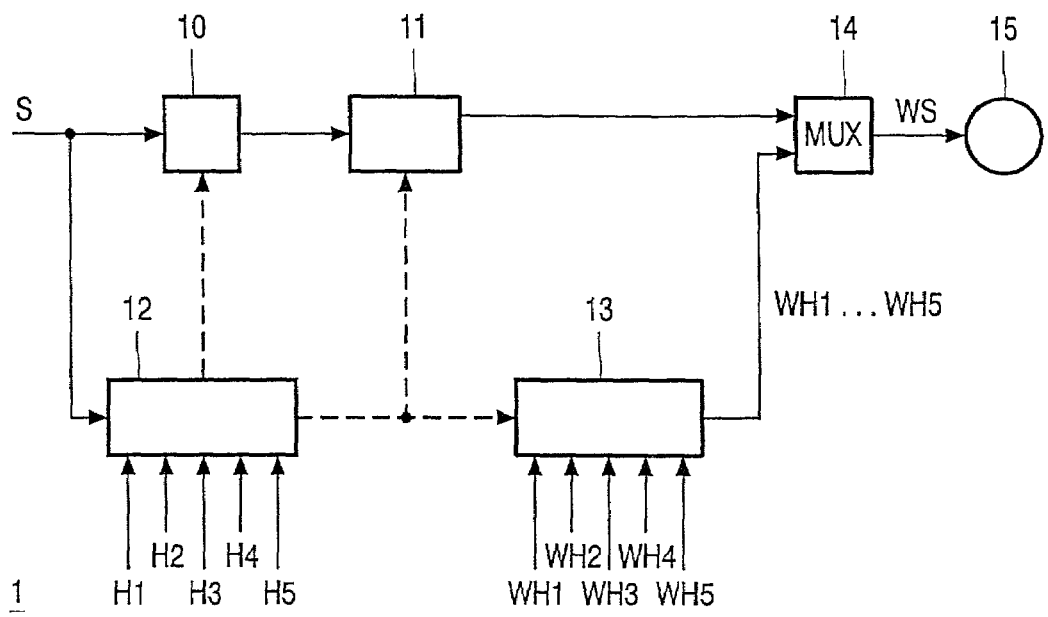
FIG. 4 shows a transmitter according to an embodiment of the invention, the transmitter comprising means for start code detection and substitution.
Figure 5:
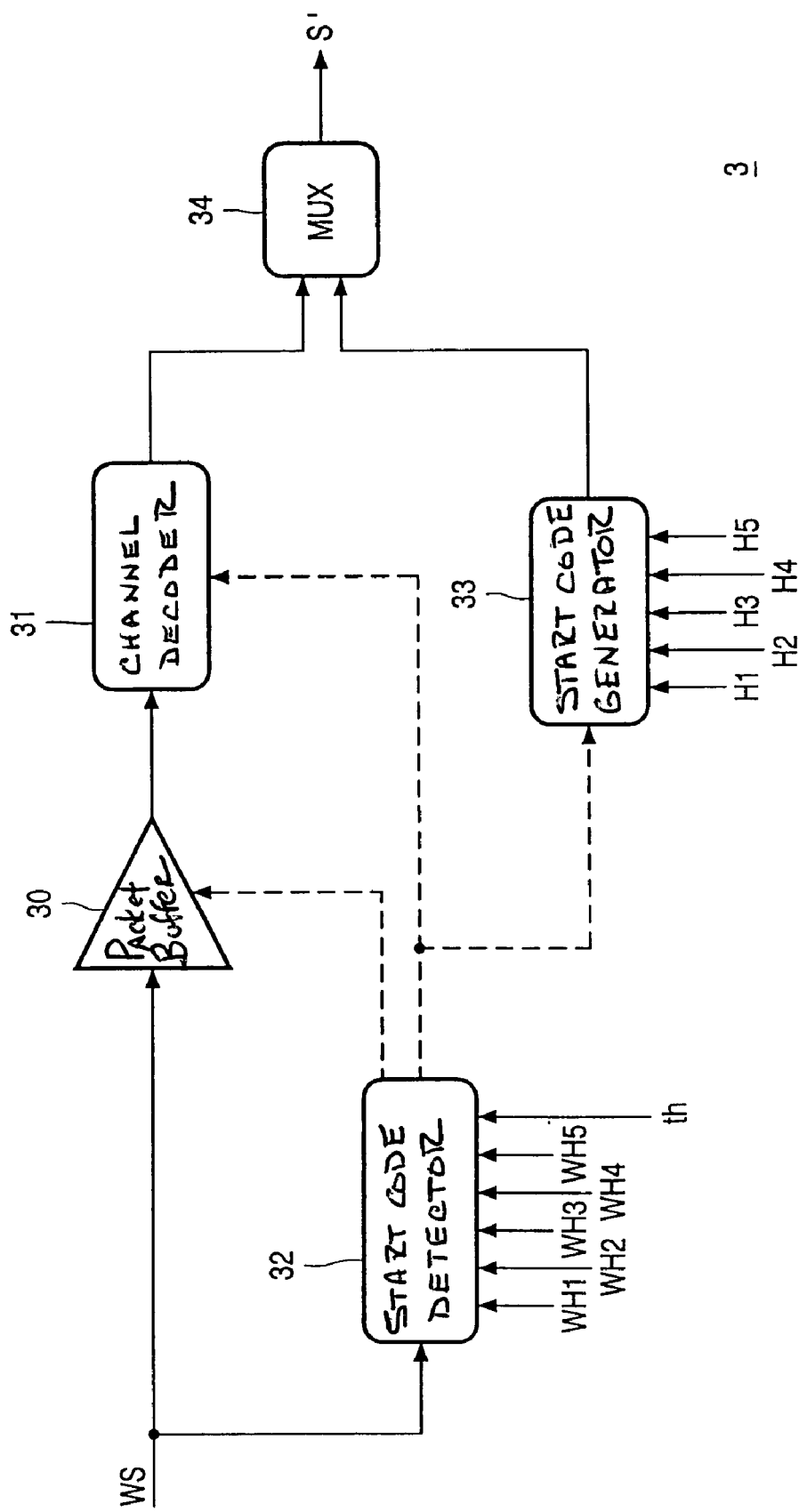
FIG. 5 shows a receiver according to an embodiment of the invention, the receiver comprising means for substituted start code detection and replacement.

The description of the advantageous embodiment is given for the simplified case of VOP's coincident with frames. In FIGS. 4 and 5 dashed lines indicate control lines.

FIG. 4 shows a transmitter according to the invention, the transmitter comprising a start code detector 12 for detection of the start codes H1 . . . H5. A detected start code is substituted by a corresponding pseudo-noise word W1 . . . WH5 by a pseudo-noise word generator 13. The pseudo-noise word WH1 . . . WH5 is furnished to a multiplexer 14 that includes the pseudo-noise word in the data stream WS to be transmitted.

The data stream S is received in packet buffer 10. Packets of the data stream S, present in between the markers H1 . . . H5, are channel encoded in a channel encoder 11 to obtain channel coded packets. These channel coded packets are furnished to the multiplexer and are included in the data stream WS to be transmitted. The transmitted data stream is furnished to an antenna, e.g. for wireless transmission, or to a storage medium 15.

Channel coding in FIG. 4 is advantageously performed using P-UEP as described above, but other channel coding mechanisms may alternatively be used.

FIGS. 5 shows a receiver 3 for receiving a data stream WS transmitted by a transmitter according to FIG. 4. In a start codes detector 32 (e.g. fact a pseudo-noise word detector), correlation evaluations are performed between each allowed pseudo-noise word (i.e. from the predetermined set of pseudo-noise words, corresponding to the markers) and the relevant bit-stream portion in order to detect pseudo-noise words representing start codes. Correlations are compared with corresponding thresholds th. When a pseudo-noise word is detected, the bit indicator in the bit-stream shifts the proper number of bits and the corresponding MPEG-4 start code H1 . . . H5 is provided by start code generator 33, which start code is inserted in a multiplexer 34 whose task is to arrange a bit-stream S'to be fed to the MPEG-4 decoder. If either a GOV start code or a VOP start code is detected, a VOP indicator changes its status.

If a resync marker is detected, a packet buffer 30 is initialized and subsequent bits fill the buffer until the next start code is detected. No correlation evaluation is performed until the buffer contains N bits, where N is the minimum length of a packet. When the next start code is detected, the buffer 30 includes one packet; channel decoding is performed on the bits in the buffer in a channel decoder 31, according to the VOP indicator information and to the percentages. The rates used in the scheme are preferably fixed and the same as used in the channel encoder 11. In the case of variable rates, the rates have to be received from the channel encoder 11 in the transmitter 1. The channel-decoded packets are inserted in the multiplexer 34 arranging the bit-stream to be fed to an MPEG-4 decoder. Note that if RCPC codes are used, de-puncturing is performed before decoding. In this case, the packet is then decoded at the mother code rate.

Although not shown in FIGS. 4 and 5, the data stream may be modulated before transmission by a modulator in the transmitter and consequently be demodulated in the receiver by a demodulator before decoding is performed.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word 'comprising' does not exclude the presence of other elements or steps than those listed in a claim. The invention can be implemented by means of hardware comprising several distinct elements, and by means of a suitably programmed computer. In a device claim enumerating several means, several of these means can be embodied by one and the same item of hardware. The mere fact that certain measures are recited in mutually different dependent claims does not indicate that a combination of these measures cannot be used to advantage.

In summary, coding a data stream is provided, wherein the data stream comprises at least one packet having a given packet length and respective partitions of the at least one packet are coded with different error protection rates, the respective lengths of the respective partitions being determined by respective predetermined percentages of the packet length or of a fraction of the packet length.

The invention claimed is:

1. A method of decoding a received data stream, the received data stream comprising at least one packet having a given packet length, wherein respective partitions of the at least one packet have been coded with different error protection rates, wherein respective lengths of the respective partitions are determined by respective predetermined percentages of the packet length wherein the respective predetermined percentages are determined such that a first partition of the packet comprises at least a first original packet partition and the sum of the first partition of the packet and a second partition of the packet comprises at least the first original partition and a second original partition of the packet, the method comprising the acts of:

decoding the respective packet partitions with the different error protection rates; and outputting the data stream having the respective packet partitions decoded with the different error protection rates.

2. An encoder for coding a data stream, the data stream comprising at least one packet having a given packet length, the encoder comprising:

means for coding respective partitions of the at least one packet with different error protection rates, wherein respective lengths of the respective partitions are determined by respective predetermined percentages of the packet length or of a fraction of the packet length wherein the respective predetermined percentages are determined such that a first partition of the packet comprises at least a first original packet partition and the sum of the first partition of the packet and a second partition of the packet comprises at least the first original partition and a second original partition of the packet; and means for outputting the data stream with the respective partitions of the at least one packet coded with the different error protection rates.

3. A decoder for decoding a received data stream, the received data stream comprising at least one packet having a given packet length, wherein respective partitions of the at least one packet have been coded with different error protection rates, wherein respective lengths of the respective partitions are determined by respective predetermined percentages of the packet length or a fraction of the packet length, wherein the respective predetermined percentages are determined such that a first partition of the packet comprises at least a first original packet partition and the sum of the first partition of the packet and a second partition of the packet comprises at least the first original partition and a second original partition of the packet, the decoder comprising:

means for decoding the respective packet partitions with the different error protection rates; and means for outputting the data stream having the respective packet partitions decoded with the different error protection rates.

4. A system configured to transmit a data stream from a transmitter to a receiver, the data stream comprising at least one packet having a given packet length, wherein respective partitions of the at least one packet have been coded with different error protection rates, wherein respective lengths of the respective partitions are determined by respective predetermined percentages of the packet length or a fraction of the packet length wherein the respective predetermined percentages are determined such that a first partition of the packet comprises at least a first original packet partition and the sum of the first partition of the packet and a second partition of the packet comprises at least the first original partition and a second original partition of the packet.

5. The system of claim 4, including a storage medium on which the data stream has been stored.

6. The system of claim 4, further comprising a transmitter for transmitting the data stream, the transmitter comprising: an encoder and antenna means for transmitting the data stream.

7. The system of claim 4, further comprising a receiver for receiving a data stream, the receiver comprising: antenna means for receiving the data stream; and a decoder as claimed in claim 3.

8. A method of coding a data stream, the data stream comprising at least one packet having a given packet length, the method comprising the acts of:

a) coding respective partitions of the at least one packet with different error protection rates, wherein respective lengths of the respective partitions are determined by respective predetermined percentages of the packet length or of a fraction of the packet length; and b) outputting the data stream with the respective partitions of the at least one packet coded with the different error protection rates, wherein the respective predetermined percentages are determined such that a first partition of the packet comprises at least a first original packet partition and the sum of the first partition of the packet and a second partition of the packet comprises at least the first original partition and a second original partition of the packet.

9. A method as claimed in claim 8, wherein the given packet length is determined as a distance between two markers in the data stream, wherein at least one of said two markers indicates a packet start.

* * * * *